(12) United States Patent
Yi et al.

(10) Patent No.: US 7,556,712 B2
(45) Date of Patent: Jul. 7, 2009

(54) LASER CLEANING OF BACKSIDE OF WAFER FOR PHOTOLITHOGRAPHIC PROCESSING

(75) Inventors: Hun-Jung Yi, Gyeonggi-do (KR); Seung-Ki Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 136 days.

(21) Appl. No.: 11/566,624

(22) Filed: Dec. 4, 2006

(65) Prior Publication Data

US 2007/0157414 A1  Jul. 12, 2007

(30) Foreign Application Priority Data

Dec. 22, 2005  (KR) ............... 10-2005-0128017

(51) Int. Cl.
  *C23F 1/00* (2006.01)
  *H01L 21/00* (2006.01)
(52) U.S. Cl. ................. 156/345.54; 438/795
(58) Field of Classification Search ........... 438/706, 438/708, 778, 780, 940, 795; 156/345.54
  See application file for complete search history.

(56) References Cited

U.S. PATENT DOCUMENTS

| | | | |
|---|---|---|---|
| 5,963,315 A * | 10/1999 | Hiatt et al. ............ | 356/237.3 |
| 6,733,594 B2 | 5/2004 | Nguyen | |
| 7,045,019 B1 * | 5/2006 | Hemker et al. ............ | 134/18 |
| 7,284,760 B2 * | 10/2007 | Siebert et al. ............ | 279/4.12 |
| 2002/0170892 A1 * | 11/2002 | Lee et al. ............ | 219/121.68 |
| 2006/0291990 A1 * | 12/2006 | Wadensweiler et al. ..... | 414/806 |

FOREIGN PATENT DOCUMENTS

| | | |
|---|---|---|
| JP | 10-064865 | 3/1998 |
| KR | 2001-0022134 | 3/2001 |
| KR | 2002-0068605 | 8/2002 |
| KR | 2002-0083371 | 11/2002 |

OTHER PUBLICATIONS

English language abstract of Korean Publication 2002-0083371.
English language abstract of Japanese Publication No. 10-064865.

* cited by examiner

*Primary Examiner*—Hsien-ming Lee
*Assistant Examiner*—Kevin Parendo
(74) *Attorney, Agent, or Firm*—Marger Johnson & McCollom, P.C.

(57) ABSTRACT

A photolithography process may be carried out after cleaning the backside of a wafer by means of an apparatus that includes an illumination module for conducting an optical illumination operation of photolithography to the front side of the wafer, and a cleaning module for conducting a cleaning operation on the wafer backside. Providing the capability of removing particles from the wafer backside and eliminating defocusing effects due to wafer chucking errors, these and other embodiments improve reliability of the photolithography process, as well as productivity and yields for the semiconductor devices.

5 Claims, 4 Drawing Sheets

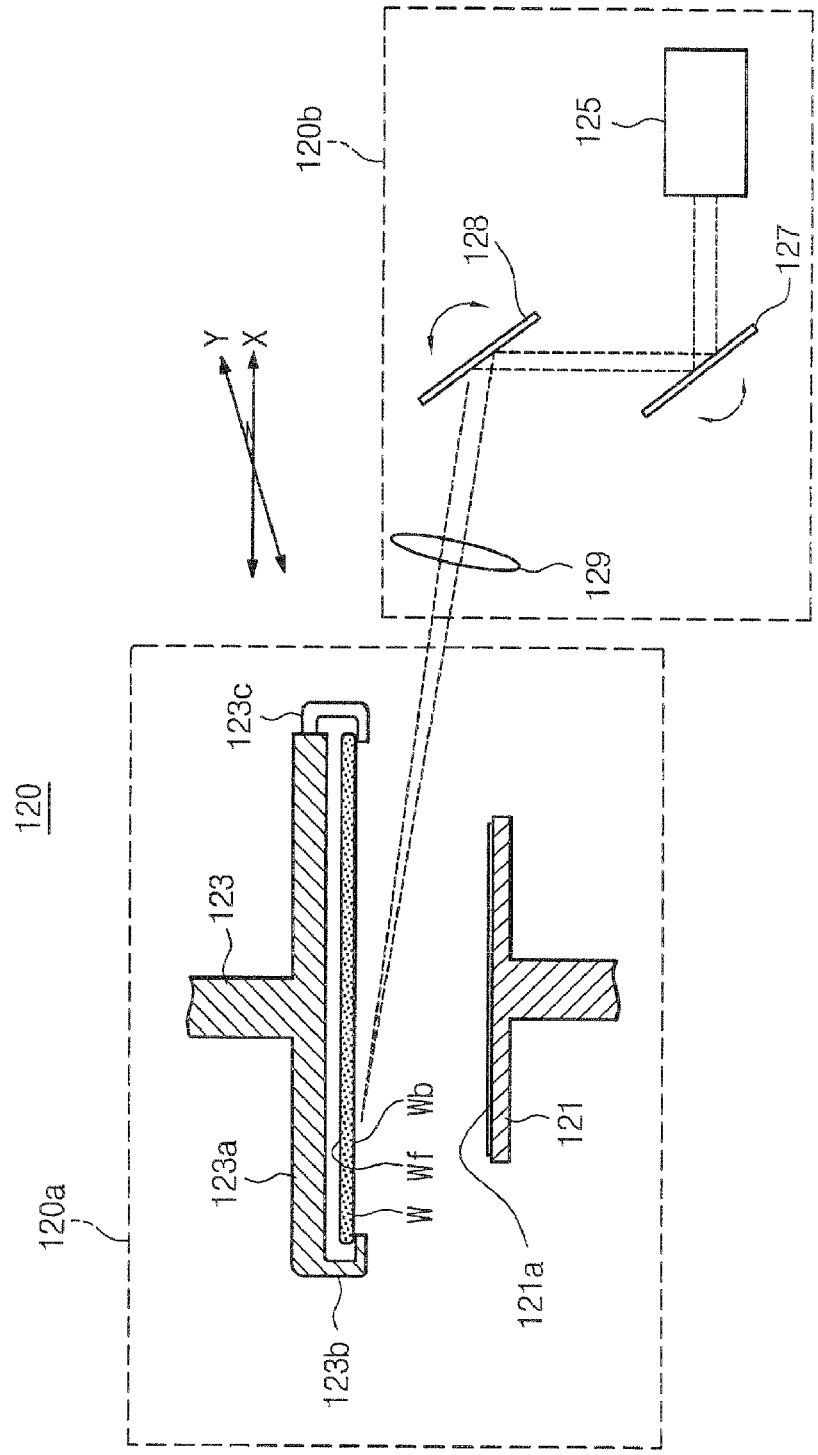

LASER CLEANING OF BACKSIDE OF WAFER FOR PHOTOLITHOGRAPHIC PROCESSING

CROSS-REFERENCE TO RELATED APPLICATIONS

This U.S. non-provisional patent application claims priority under 35 U.S.C. § 119 of Korean Patent Application No. 2005-128017 filed on Dec. 22, 2005, the entire contents of which are hereby incorporated by reference.

BACKGROUND

The embodiments described herein relate to technology for manufacturing semiconductor devices. In particular, the embodiments relate to an apparatus and method for manufacturing semiconductor devices, capable of removing defocusing effects in photolithography processes.

In fabricating semiconductor devices, a design rule may be reduced by utilizing conditions having increasingly precise control for the photolithography processes involved.

An illumination operation, e.g., an exposure operation to transcribe a specific pattern onto a wafer through a reticle, is regarded as an important step of the photolithography process. There have been many studies of photoresist films and developments of optics and light sources for illumination of the photolithography process. However, as the semiconductor manufacturing process becomes more demanding with a reduced design rule, one needs to improve peripheral techniques as well as the exposure processing technique itself.

One of the peripheral techniques is to regulate roughness on the backside of a wafer. The roughness on the wafer backside usually causes defocusing effects at specific regions, generating process defects. The roughness on the wafer backside is mostly caused by absorption of particles. Namely, the roughness on the wafer backside is considered to be generated from deposition or absorption of particles, which have been caused by prior processing steps such as deposition or etching.

Conventionally, a wet cleaning operation is carried out to lessen such defocusing effects. But the wet cleaning is principally operative to remove particles or pollutants from the front side of the wafer. Recently, single wafer processing equipment is widely used for flexibility corresponding to processing variations and for prevention of particle transcription to the front side of the wafer. Even if the wet cleaning operation is conducted, polluting particles would not be completely removed because of the following consideration: During a standby time from the cleaning step to the photolithography step, these particle pollutants can flow into the photolithography equipment, resulting in an accumulation of pollution. These particles can contaminate a wafer chuck among the photolithography equipment, causing chuck failures and defocusing effects. This obviously harms the photolithography process, degrading productivity and yields.

SUMMARY

Accordingly, embodiments are directed to solve the aforementioned problems in the conventional arts. These embodiments provide an apparatus and method for manufacturing semiconductor devices, capable of preventing defocusing effects in a photolithography process.

In an embodiment, an apparatus is comprised of a cleaning module installed at an illumination module, for removing particles from a wafer backside, by which the wafer backside is treated in a dry etching mode before an exposure step by the illumination module.

An embodiment includes an apparatus for manufacturing semiconductor devices, comprising an illumination module configured to conduct an optical illumination process of photolithography for the front side of a wafer, and a cleaning module configured to conduct a cleaning process on the backside of the wafer.

In this embodiment, the cleaning module is a dry cleaning module. The dry cleaning module cleans the backside of the wafer by means of a shock wave.

In this embodiment, the dry cleaning module comprises a wafer holding section configured to hold the wafer, and a laser irradiation section configured to irradiate laser on the backside of the wafer held by the wafer holder.

In this embodiment, the wafer holder includes: a wafer chuck configured to horizontally chuck the wafer in contact with the backside of the wafer; and a wafer holder configured to horizontally hold the wafer without contacting with the front side of the wafer, separating the wafer from the wafer chuck and disclosing the backside of the wafer.

In this embodiment, the wafer holder comprises a first member horizontally extending with confronting the front side of the wafer; and pluralities of second members extending downward from ends of the first member and contacting with edges of the backside of the wafer. At least one of the second members is configured to be movable in a predetermined interval from the end of the first member.

In this embodiment, the laser irradiation section comprises: a laser source generating laser to be irradiated on the backside of the wafer; a mirror altering a path of the laser emitted from the laser source; and a lens focusing the laser on a specific point in the backside of the wafer.

In this embodiment, the wafer holding section comprises a wafer holder configured to hold the wafer, the wafer holder being horizontally movable to alter a focusing position of laser, which is to be irradiated on the backside of the wafer, into a first direction.

In this embodiment, the laser irradiation section comprises a mirror configured to alter a path of the laser, the mirror being controllable to alter the focusing position of laser, which is to be irradiated on the backside of the wafer, into a second direction orthogonal to the first direction.

In another embodiment of the present invention, an apparatus for manufacturing semiconductor devices comprises: a storage unit loading wafers; a laser cleaning unit disclosing the backside of a wafer supplied from the storage unit and dry cleaning the backside of the wafer by irradiating laser on the backside of the wafer; an illumination unit conducting an exposure process to the front side of the wafer that has been treated in a dry cleaning operation by the laser cleaning unit; and a transportation unit carrying the wafer among the storage unit, the laser cleaning unit, and the illumination unit.

In this embodiment, the apparatus further comprises a buffer unit temporarily storing the wafer.

In this embodiment, the laser cleaning unit includes: a wafer holding section configured to hold the wafer and to move a focusing position of the laser along a first axis direction; and a laser irradiation section configured to irradiate the laser on the backside of the wafer and to move the focusing position of the laser along a second axis direction orthogonal to the first axis direction.

In this embodiment, the laser irradiation section comprises: a laser source emitting the laser; at least two mirrors moving the focusing position of the laser along the first axis direction so as to alter a path of the laser emitted from the laser source; and a lens focusing the laser, which has passed through said two mirrors, on a specific position of the backside of the wafer.

In this embodiment, the wafer holding section comprises: a wafer chuck operable in ascending and descending with horizontally chucking the wafer in contact to the backside of the wafer; and a wafer holder horizontally movable to make the focusing position of the laser move along the first axis direction, horizontally holding the wafer without contacting to the front side of the wafer, separating the wafer from the wafer chuck, and disclosing the backside of the wafer.

In this embodiment, the wafer holder comprises pluralities of point contact members configured to contact with edges of the backside of the wafer. At least one of the point contact members is a mobile point contact member. The mobile point contact member moves toward the center of the wafer by a predetermined interval when the wafer holder grips the holder.

Another aspect of the present invention is a method for manufacturing semiconductor devices, which has a photolithography process. The method is comprised of: providing a wafer as a target for the photolithography process; cleaning the backside of the wafer by laser in a dry mode; and conducting the photolithography process to the front side of the wafer.

In this embodiment, conducting the photolithography process to the front side of the wafer is carried out after cleaning the backside of the wafer by laser in the dry mode.

In this embodiment, the photolithography process comprises an exposure operation to irradiate and focus light on the front side of the wafer.

According to the present invention, before carrying out an optical illumination process such as the exposure operation to the wafer, the dry cleaning operation is conducted on the wafer backside by means of laser. Thereby, particles can be removed from the wafer backside, being free from defocusing effects which would be caused by wafer chucking failures therein.

A further understanding of the nature and advantages of these embodiments herein may be realized by reference to the remaining portions of the specification and the attached drawings.

BRIEF DESCRIPTION OF THE FIGURES

The accompanying figures are included to provide a further understanding of the embodiments, and are incorporated in and constitute a part of this specification. The drawings illustrate exemplary embodiments and, together with the description, serve to explain principles of the present invention. In the figures:

FIG. 2 is a cross-sectional diagram illustrating a cleaning module of the apparatus for manufacturing the semiconductor devices, according to an embodiment;

DETAILED DESCRIPTION

Figure 1:
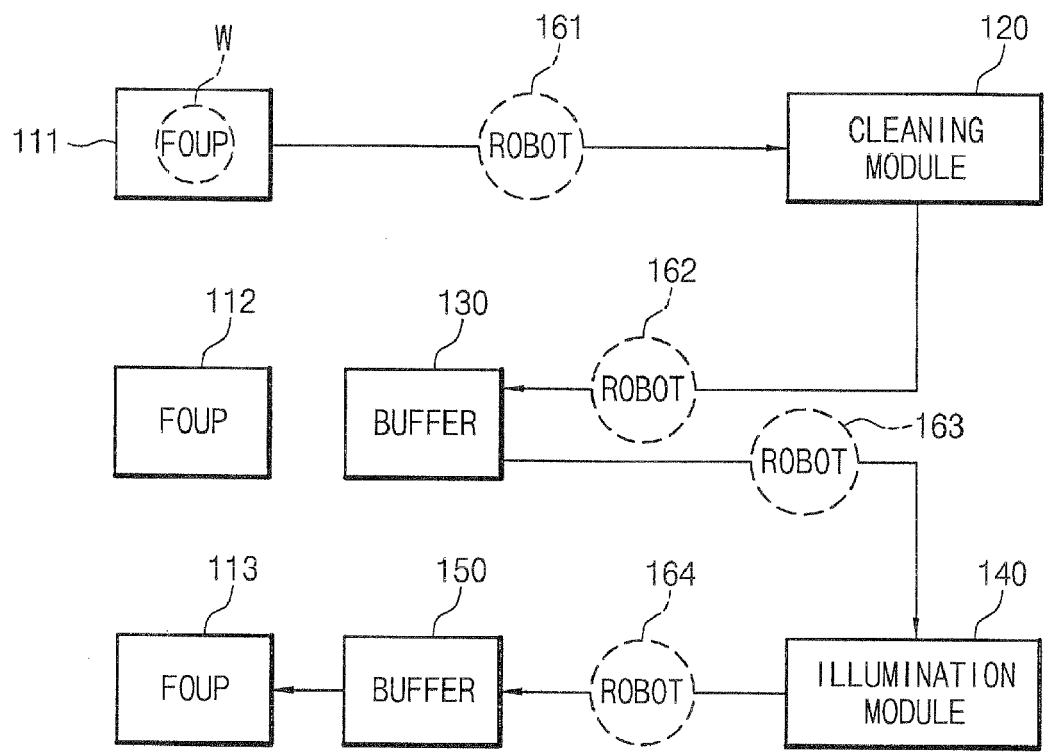
FIG. 1 is a diagram illustrating an apparatus for manufacturing semiconductor devices, according to an embodiment.

Preferred embodiments will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

FIG. 1 is a diagram illustrating an apparatus for manufacturing semiconductor devices, according to an embodiment.

Referring to FIG. 1, a semiconductor manufacturing apparatus is comprised of an illumination module 140, e.g., an exposure device, to transcribe a specific pattern onto a wafer. The illumination module may include a light source, a stepper, or a scanner, and is able to carry out an exposure operation, which is arguably the most important step of the photolithography process. The illumination module 140 is supplied with a wafer W, which is a process target for the photolithography, from front-opening unified pods (FOUPs) 111, 112, and 113.

The semiconductor manufacturing apparatus may also be comprised of a cleaning module 120 to remove particles from the backside of the wafer W. The semiconductor manufacturing apparatus may be further comprised of buffers 130 and 150 to store wafers. The buffer 130 may be downstream of the cleaning module 120. The buffer 150 may be downstream of the illumination module 140. Transportation of the wafers among the FOUPs 111~113, the cleaning module 120, the illumination module 140, and the buffers 130 and 150 may be carried out by a plurality of wafer conveying robots 161~164. As an example, the robot 161 transports wafers from the FOUPs 111~113 to the cleaning module 120 and from the buffer 150 to the FOUPs 111~113. The robot 162 transports wafers from the cleaning module 120 to the buffer 130. The robot 163 transports wafers from the buffer 130 to the illumination module 140. The robot 164 transports wafers from the illumination module 140 to the buffer 150. Some of these processes are indicated in FIG. 1.

In this embodiment, the wafer backside means a face of the wafer, i.e., one of its two sides, which is the opposite side to the front side on which a specific pattern is engraved by means of the exposure process. The front side of the wafer is engraved with a specific circuit pattern or formed with a film. Meanwhile, the backside of the wafer, as mentioned earlier, may have particles deposited or absorbed in its surface, these particles being generated from processing steps of depositing or etching. Such particles that are present on the wafer backside may cause an unstable chuck condition with the wafer during the exposure operation in the illumination module 140, resulting in defocusing effects on the front side of the wafer.

Therefore, in need of improving a condition of roughness on the wafer backside, the semiconductor manufacturing apparatus according to embodiments is operable to include the cleaning module 120 for removing particles from the wafer backside before transporting the wafer into the illumination module 140 for the exposure operation. The cleaning module 120 preferably utilizes a dry cleaning mode by means of a laser. This dry cleaning mode is advantageous over a wet cleaning mode that needs an additional device for wastes after cleaning or to complete drying-up.

FIG. 2 is a cross-sectional diagram illustrating the cleaning module 120 of the apparatus for manufacturing the semiconductor devices, according to an embodiment.

Referring to FIG. 2, the cleaning module 120 of this embodiment is comprised of a wafer holding section 120a for holding the wafer W, and a laser irradiation section 120b for irradiating a laser toward the backside Wb of the wafer W.

The wafer holding section 120a includes a wafer chuck 121 providing a place on which the wafer W is settled, and a wafer holder 123 for holding the wafer W. The wafer chuck 121 is an implement for settling (i.e., chucking) the wafer W thereon, in which the front side Wf of the wafer W faces upward while the backside Wb confronts the top face 121a of the chuck 121. For example, chucking the wafer W may be achieved by electrostatic force. The wafer chuck may be designed to be movable up and down. The wafer holder 123 holds the wafer W, being operable to move up and down. In operation, the wafer W may be lifted from the wafer chuck 121, while being held by the wafer holder 123, when the wafer holder 123 ascends, when the wafer chuck 121 descends, or when the wafer holder 123 ascends while the wafer chuck 121 descends.

Because there may be a specific pattern on the front side Wf of the wafer W, the wafer holder 123 preferably grasps the wafer at the edge of the backside Wb, not directly with the front side Wf. For example, to assure a safe wafer-holding condition, the wafer holder 123 may hold the wafer at three or more points near the edge of the backside Wb, at 120° intervals. The wafer holder 123 preferably holds the wafer W so that contact area between the wafer holder 123 and the backside Wb of the wafer W is minimized. This offers safe wafer-holding conditions that avoid damaging any patterns on the front side Wf of the wafer W. This also minimizes pollution on the backside Wb caused by contact.

The wafer holder 123 may comprise a member 123a extending horizontally, and horseshoe-shaped members 123b and 123c that extend from both ends of the horizontal member 123a. The horseshoe-shaped members 123b and 123c may hold the edge of the backside Wb. While the embodiment of FIG. 2 shows two horseshoe-shaped members 123b and 123c extending from both ends of the horizontal member 123a, the number of the horseshoe-shaped members is variable, such as the three, as aforementioned. At least one of the horseshoe-shaped members 123b and 123c may be designed to be movable from the horizontal member 123a in a predetermined interval to be extendable and contractible along the horizontal direction.

Hereinafter, for the present embodiment, 'opening' refers to a motion of the horseshoe-shaped members 123b and 123c opening outward, while 'closing' refers to a motion of closing inward.

If the wafer W is settled on the chuck 121, the wafer W comes near the wafer holder 123 when the chuck 121 ascends or the wafer holder 123 descends. In this condition, the horseshoe-shaped member 123c repositions inward toward the center of the wafer W to hold the wafer W. Horseshoe-shaped members 123b also contributes to holding, as shown in FIG. 2. In this way, the mobile horseshoe-shaped member 123c avoids damaging the wafer W by excessive stress while the wafer W is being held, rather than a conventional fixed type horseshoe-shaped member.

The laser irradiation section 120b applies laser beam toward the backside Wb of the wafer W that is gripped parallel to the wafer holder 123. As shown in the embodiment of FIG. 2, the laser irradiation section 120b may include a laser source 125 to generate the laser beam, mirrors 127 and 128 to alter the laser beam's path, and a lens 129 to focus the laser beam onto a specific region of the wafer W.

The laser source 125 may be a Nd:YAG laser with a wavelength of 1.06 µm, which is a kind of solid-state laser capable of oscillating in continuous or pulsed modes. The mirrors 127 and 128 alter the path of the laser beam to irradiate a specific region of the backside Wb. The laser beam generated from the laser source 125 is guided toward the backside Wb of the wafer W that is gripped by the wafer holder 123 and focused on the specific region of the backside Wb by the lens 129.

Preferably, in this embodiment, one or all of the mirrors 127 and 128 are variable in angle, so that the position of the focus of the laser beam is conveniently adjusted along an X direction onto the backside Wb. And the wafer holder 123 is preferably movable along front and rear directions Y corresponding to the laser irradiation points adjusted by the mirrors 127 and 128 in the X direction. Thus, this adjustment capability allows laser irradiation to cover the entire backside Wb. X and Y directions are indicated in FIG. 2.

Figure 3A:
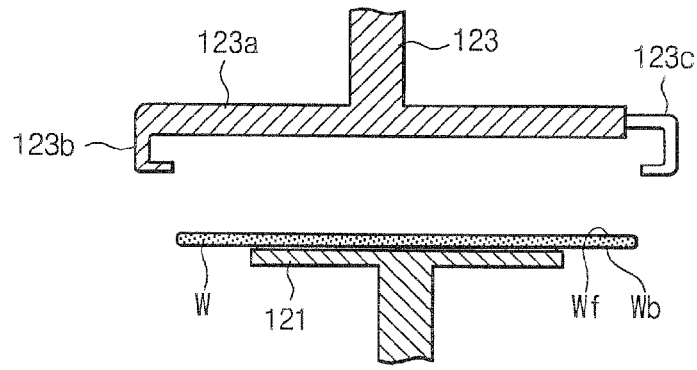
FIGS. 3A through 3C are cross-sectional diagrams illustrating processing steps in the cleaning module of the apparatus for manufacturing the semiconductor devices, according to an embodiment.
Figure 3B:
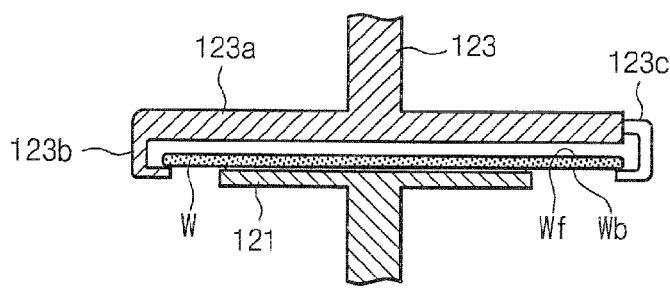
Figure 3C:
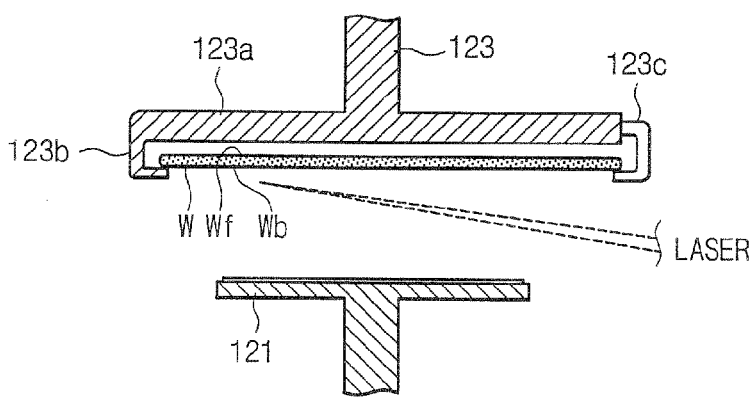

FIGS. 3A through 3C illustrate processing steps of the wafer-holding and cleaning operations in the cleaning module 120 of the semiconductor manufacturing apparatus, according to the present embodiment.

First, referring to FIG. 3A, the wafer W is horizontally chucked so that the front side Wf faces upward while the backside Wb abuts the wafer chuck 121. The wafer holder 123 includes a horseshoe-shaped member 123c that may open to prepare for holding the wafer W. At this time, the wafer W is conditioned before the exposure step by the illumination module 140.

Then, referring to FIG. 3B, when the wafer W is settled on the wafer chuck 121, the wafer W moves towards the wafer holder 123. The approach of the wafer W can be accomplished by elevating the wafer chuck 121 or lowering the wafer holder 123, as mentioned above. When the wafer W approaches the wafer holder 123 and locates between the horseshoe-shaped members 123b and 123c, closing the horseshoe-shaped member 123c allows the wafer holder 123 to grip the wafer W.

Next, referring to FIG. 3C, if the wafer W is gripped by the wafer holder 123, the wafer chuck 121 may descend to entirely expose the backside Wb of the wafer W. Then the laser irradiation section 120b may apply the laser beam to the wafer W to remove particles from the backside Wb in a dry cleaning mode.

Removing particles from the backside Wb by means of the dry cleaning mode with the laser beam is carried out in the following mechanism. Returning to the embodiment of FIG. 2, the laser beam emitted from the laser source 125 is focused on a specific position on the backside Wb after passing through the lens 129. When the intensity of the laser beam rises above a critical point, gas adjacent to the focused region is ionized. This causes the gas to expand in density, generating a shock wave. Transitional energy by such a shock wave is transmitted to particles, so that the particles are detached from the backside Wb by a rolling effect.

As illustrated in FIG. 3B, after completing the cleaning operation for the backside Wb, the wafer chuck 121 ascends to a position for chucking the wafer W that is being gripped by the wafer holder 123.

As indicated in FIG. 3A, when the wafer chuck 121 ascends to the position necessary for settling the wafer W on the wafer chuck 121, the opening horseshoe-shaped member 123c releases the wafer W from the holding state. The wafer W released from the holding state is laid on the wafer chuck 121, which then descends with the wafer W. Afterwards, the wafer W may be transported from the cleaning module 120 into the illumination module 140 and then put into the exposure step.

Figure 4:
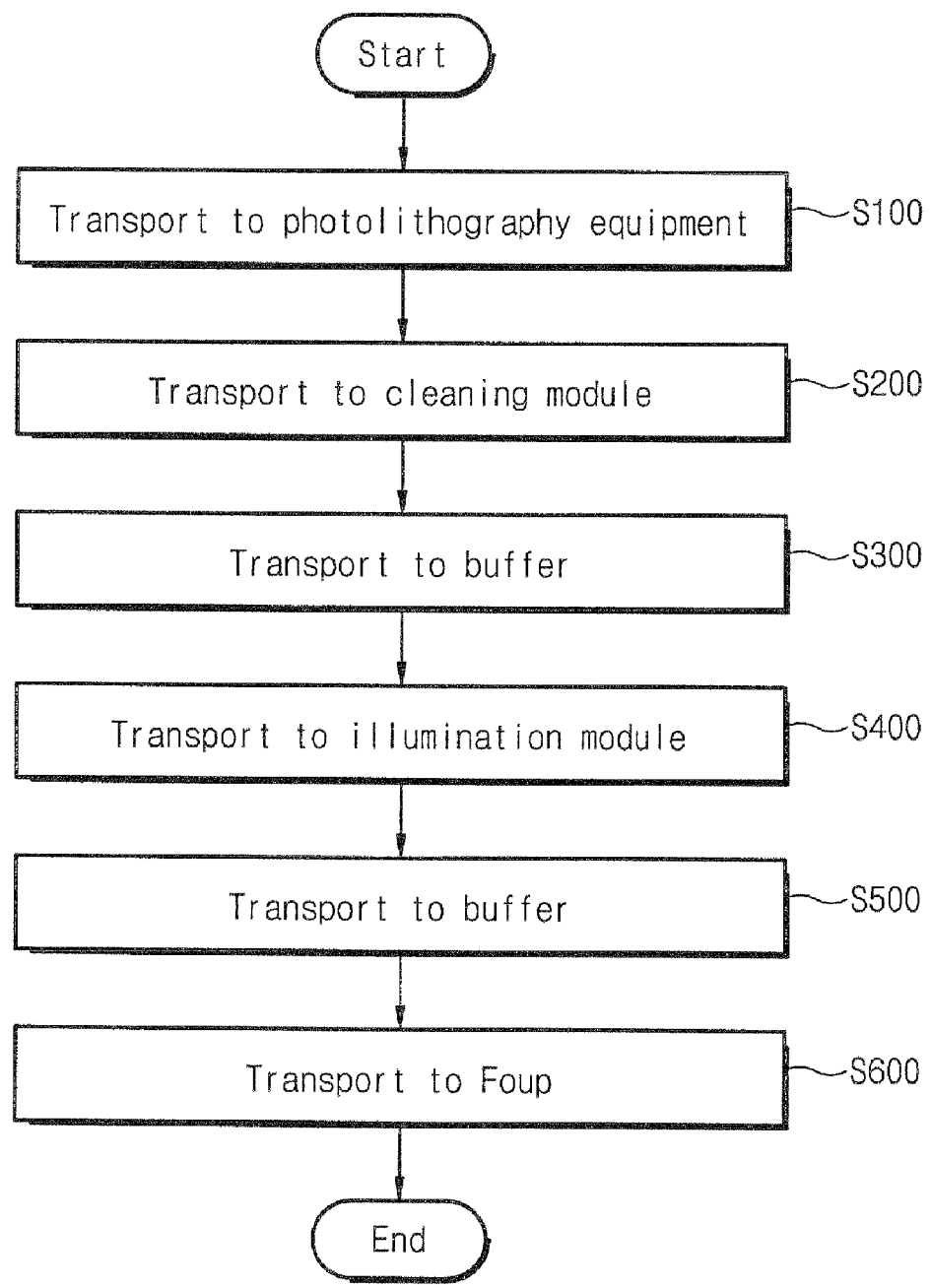
FIG. 4 is a flow chart showing a method for manufacturing the semiconductor devices, according to an embodiment.

FIG. 4 is a flow chart showing an embodiment of a method for manufacturing the semiconductor devices. The following description with FIG. 4 will proceed in conjunction with FIG. 1.

First, the wafers W are put into the semiconductor manufacturing apparatus according to this embodiment. The semiconductor manufacturing apparatus of this embodiment is a kind of photolithography equipment that includes the illumination module 120, such as a scanner or a stepper. The wafers W put into the semiconductor manufacturing apparatus may be stacked in the FOUPs 111~113 while waiting their turn to be processed. Any number of FOUPs may be included in the semiconductor manufacturing apparatus, instead of being limited to the FOUPs 111~113 illustrated in this embodiment.

The wafers W stacked in one of the FOUPs, e.g., 111 may first be put into the cleaning module 120 before being loaded into the illumination module 140 (S200). In the embodiment of FIG. 1, the solid arrows indicate flows of transporting the wafers W. The transportation of the wafers W may be carried out by the robots 161~164.

With the wafer W conveyed into the cleaning module 120, the backside Wb may be washed by the dry cleaning mode of the laser beam, as described above. After cleaning the backside Wb, the wafer W may be removed from the cleaning module 120. The wafer W may then be transported into the buffer 130 by the robot 162 for waiting (S300).

The wafer W conveyed into the buffer 130 may then be transported into the illumination module 140 by the robot 163 (S400). As mentioned above, the illumination module 140 is a kind of photolithography equipment that includes optics, such as a scanner or stepper. Since the wafer W placed into the illumination module 140 has been cleaned on the backside Wb by the cleaning module 120 in the previous step, there is no unstable chucking condition due to particles deposited or absorbed on the backside Wb. Thus defocusing effects may be eliminated. The wafer W passing through the exposure process in the illumination module 140 may be transported into the buffer 150 by the robot 140 (S500). In a continuous fashion, the wafers W temporarily stored in the buffer 150 may be placed into the FOUP 113 by the robot 161 and then stacked (S600).

As described above, according to the embodiments, before conducting the optical illumination process such as the exposure operation to the wafer, the dry cleaning operation may be carried out on the backside of the wafer by means of a laser beam. Then particles may be removed from the backside of the wafer. This allows the wafer to be free from any defocusing effects due to unstable chucking conditions of the wafer. Thus, the reliability of photolithography process may be improved, as well as the productivity and yields of the semiconductor devices.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for manufacturing semiconductor devices, comprising:
    a dry cleaning module configured to conduct a cleaning process on a backside of a wafer, resulting in a cleaned wafer, the dry cleaning module including:
        a laser irradiation section configured to irradiate a laser beam onto the backside of the wafer, and
        a wafer holder configured to hold the wafer in contact with edges of the backside of the wafer so as to expose the backside of the wafer to the laser beam but without contact with a front side of the wafer; and
        a wafer chuck configured to chuck the backside of the wafer, to deliver the wafer to the wafer holder, and to receive the cleaned wafer from the wafer holder; and
    an illumination module configured to conduct an optical illumination process of photolithography on the front side of the cleaned wafer,
    wherein the wafer holder has a horizontally extending first member that extends along the front side of the wafer, above the front side of the wafer, and has a plurality of second members that extend downward from ends of the first member, past sides of the wafer, and that contact the edges of the backside of the wafer.

2. The apparatus as set forth in claim 1, wherein the laser irradiation section is configured to clean the backside of the wafer by means of a shock wave.

3. The apparatus as set forth in claim 1, wherein at least one of the plurality of second members is moveable in a predetermined interval from one of the ends of the first member.

4. The apparatus as set forth in claim 1, wherein the laser irradiation section comprises:
    a laser source adapted to emit the laser beam in a path;
    a mirror interposed within the path of the laser beam and adapted to alter the path of the laser beam emitted from the laser source; and
    a lens adapted to focus the laser beam onto a specific point on the backside of the wafer.

5. The apparatus as set forth in claim 1, wherein the wafer holder is horizontally movable in a first direction to alter a focusing position of the laser beam,
    wherein the laser irradiation section comprises a mirror that is controllable to alter the focusing position of the laser beam in a second direction orthogonal to the first direction.

* * * * *

UNITED STATES PATENT AND TRADEMARK OFFICE
CERTIFICATE OF CORRECTION

PATENT NO. : 7,556,712 B2  Page 1 of 1
APPLICATION NO. : 11/566624
DATED : July 7, 2009
INVENTOR(S) : Hun-Jung Yi et al.

It is certified that error appears in the above-identified patent and that said Letters Patent is hereby corrected as shown below:

Column 7, line 11, the word "111" should read -- 111, --.

Signed and Sealed this

Twenty-second Day of September, 2009

David J. Kappos
*Director of the United States Patent and Trademark Office*